United States Patent
Suh et al.

(10) Patent No.: US 9,281,446 B2
(45) Date of Patent: Mar. 8, 2016

(54) LIGHT-EMITTING DIODE AND METHOD FOR MANUFACTURING SAME

(71) Applicant: Seoul Viosys Co., Ltd., Ansan-si (KR)

(72) Inventors: Duk Il Suh, Ansan-si (KR); Kyoung Wan Kim, Ansan-si (KR); Yeo Jin Yoon, Ansan-si (KR); Ji Hye Kim, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/385,113

(22) PCT Filed: Feb. 27, 2013

(86) PCT No.: PCT/KR2013/001552
§ 371 (c)(1),
(2) Date: Dec. 3, 2014

(87) PCT Pub. No.: WO2013/137571
PCT Pub. Date: Sep. 19, 2013

(65) Prior Publication Data
US 2015/0076446 A1 Mar. 19, 2015

(30) Foreign Application Priority Data
Mar. 14, 2012 (KR) ......... 10-2012-0026240

(51) Int. Cl.
H01L 33/38 (2010.01)
H01L 33/24 (2010.01)
H01L 33/00 (2010.01)
H01L 33/06 (2010.01)
H01L 33/10 (2010.01)
(Continued)

(52) U.S. Cl.
CPC ............ *H01L 33/24* (2013.01); *H01L 33/0025* (2013.01); *H01L 33/0075* (2013.01); *H01L 33/06* (2013.01); *H01L 33/10* (2013.01); *H01L 33/32* (2013.01); *H01L 33/382* (2013.01); *H01L 33/42* (2013.01); *H01L 2933/0016* (2013.01); *H01L 2933/0058* (2013.01)

(58) Field of Classification Search
CPC . H01L 33/0025; H01L 33/0075; H01L 33/06; H01L 33/10; H01L 33/24; H01L 33/32; H01L 33/382; H01L 33/42
See application file for complete search history.

(56) References Cited

U.S. PATENT DOCUMENTS 5,438,212 A * 8/1995 Okaniwa ................ 257/275
6,611,002 B2 * 8/2003 Weeks et al. ............ 257/94
7,233,028 B2 * 6/2007 Weeks et al. ............ 257/98
(Continued)

FOREIGN PATENT DOCUMENTS

JP 2007073734 A 3/2007
KR 1020050044518 A 5/2005
(Continued)

*Primary Examiner* — Allan R Wilson
(74) *Attorney, Agent, or Firm* — Perkins Coie LLP

(57) ABSTRACT

Disclosed are a light emitting diode and a method of fabricating the same. The light emitting diode includes a GaN substrate having a plurality of through-holes; a GaN-based semiconductor stack structure placed on the substrate and including a first conductive-type semiconductor layer, an active layer, and a second conductive-type semiconductor layer; and a first electrode electrically connected to the first conductive-type semiconductor layer via the through-holes. The light emitting diode can reduce crystal defects and prevent reduction in light emitting area.

17 Claims, 3 Drawing Sheets

(51) Int. Cl.
*H01L 33/32* (2010.01)
*H01L 33/42* (2010.01)

(56) References Cited

U.S. PATENT DOCUMENTS

| | | | | |
|---|---|---|---|---|
| 8,680,570 | B2 * | 3/2014 | Therrien et al. | 257/103 |
| 8,866,178 | B2 * | 10/2014 | Choi et al. | 257/98 |
| 2002/0074556 | A1 * | 6/2002 | Kwak et al. | 257/79 |
| 2002/0117681 | A1 * | 8/2002 | Weeks et al. | 257/106 |
| 2009/0325334 | A1 * | 12/2009 | Kwak et al. | 438/46 |
| 2011/0198609 | A1 * | 8/2011 | Huang | 257/76 |
| 2012/0007118 | A1 * | 1/2012 | Choi et al. | 257/98 |
| 2012/0049219 | A1 * | 3/2012 | Kamiya et al. | 257/98 |

FOREIGN PATENT DOCUMENTS

| | | |
|---|---|---|
| KR | 1020080002199 A | 1/2008 |
| KR | 1020080076308 A | 8/2008 |
| KR | 1020110104693 A | 9/2011 |

* cited by examiner

LIGHT-EMITTING DIODE AND METHOD FOR MANUFACTURING SAME

This patent document is a 35 U.S.C. 371 National Stage application of PCT Application No. PCT/KR2013/001552 entitled "LIGHT-EMITTING DIODE AND METHOD FOR MANUFACTURING SAME," filed on Feb. 27, 2013, which claims the benefit of priority to Korean Patent Application No. 10-2012-0026240 entitled "LIGHT EMITTING DIODE AND A METHOD FOR MANUFACTURING LIGHT EMITTING DIODE," filed on Mar. 14, 2012. The entire disclosures of the above applications are incorporated by reference as part of this document.

BACKGROUND

1. Field of the Invention

The present invention relates to a light emitting diode (LED) and a method of fabricating the same, and more particularly, to a light emitting diode having a GaN substrate and a method of fabricating the same.

2. Discussion of Related Art

Generally, a light emitting diode can be formed by growing GaN-based semiconductor layers on a sapphire substrate. However, since the sapphire substrate and GaN layers have large differences in their coefficients of thermal expansion and lattice constants, the GaN layers grown on the sapphire substrate tend to contain many crystal defects such as threading dislocations, and the like. These crystal defects can make it difficult to improve electrical and optical properties of the light emitting diode.

Furthermore, since the sapphire substrate is an electrically insulating material, the resulting light emitting diode has a lateral structure in which electrodes are disposed above the substrate. The light emitting diode of the lateral structure tends to suffer from considerable area loss due to elimination of some portions of an active area for forming electrodes, and substantial light loss caused by the electrodes. On the other hand, a flip-chip type light emitting diode is used or can be used to overcome these problems of the light emitting diode having the lateral structure. The flip-chip type light emitting diode emits light through a substrate, to reduce light loss caused by electrodes. However, the flip-chip type light emitting diode also tend to require elimination of some portions of the active area for forming electrodes, that tend to cause area loss.

SUMMARY OF THE INVENTION

The present invention is aimed at providing a light emitting diode that can reduce crystal defects, thereby providing improved luminous efficiency, and a method of fabricating the same.

In addition, the present invention is aimed at providing a light emitting diode that can prevent reduction in light emitting area, and a method of fabricating the same.

Further, the present invention is aimed at providing a light emitting diode that can achieve uniform spreading of electric current into an active area, and a method of fabricating the same.

In accordance with one aspect of the present invention, a light emitting diode includes: a GaN substrate having through-holes; a GaN-based semiconductor stack or laminate structure placed on the substrate, and including a first conductive-type semiconductor layer, a second conductive-type semiconductor layer, and an active layer interposed between the first conductive-type semiconductor layer and the second conductive-type semiconductor layer, wherein the first conductive-type semiconductor layer is disposed closer to the substrate than the second conductive-type semiconductor layer; and a first electrode electrically connected to the first conductive-type semiconductor layer via the through-holes.

The light emitting diode can further include a reflector interposed between the first electrode and the GaN substrate.

The light emitting diode can further include a second electrode electrically connected to the second conductive-type semiconductor layer. The second electrode can be placed on the second conductive-type semiconductor layer to be connected to the second conductive-type semiconductor layer, without being limited a specific type of placement. Alternatively, for example, the second electrode can be electrically connected to the second conductive-type semiconductor layer via a through-hole passing through the GaN substrate, the first conductive-type semiconductor layer, and the active layer.

In accordance with another aspect of the present invention, a method of fabricating a light emitting diode includes: growing a first conductive-type semiconductor layer, an active layer, and a second conductive-type semiconductor layer on a GaN substrate; forming through-holes in the GaN substrate to expose the first conductive-type semiconductor layer; and forming a first electrode electrically connected to the first conductive-type semiconductor layer via the through-holes.

The method may further include forming a reflector covering a lower surface of the GaN substrate, before forming the first electrode. Further, the reflector may cover sidewalls of the through-holes.

The method may further include: forming a through-hole passing through the GaN substrate, the first conductive-type semiconductor layer, and the active layer; and forming a second electrode electrically connected to the second conductive-type semiconductor layer via the through-hole passing through the active layer.

According to embodiments of the present invention, use of the GaN substrate can or potentially can reduce crystal defects in the first conductive-type semiconductor layer, the active layer, and the second conductive-type semiconductor layer, thereby providing improved luminous efficacy. In addition, the first electrode is electrically connected to the first conductive-type semiconductor layer through the GaN substrate, thereby preventing reduction in light emitting area due to formation of the first electrode. Furthermore, the first electrode is electrically connected to the first conductive-type semiconductor layer via through-holes to allow or potentially allow uniform spreading of electric current in the active area.

DETAILED DESCRIPTION OF EXEMPLARY EMBODIMENTS

Figure 1:
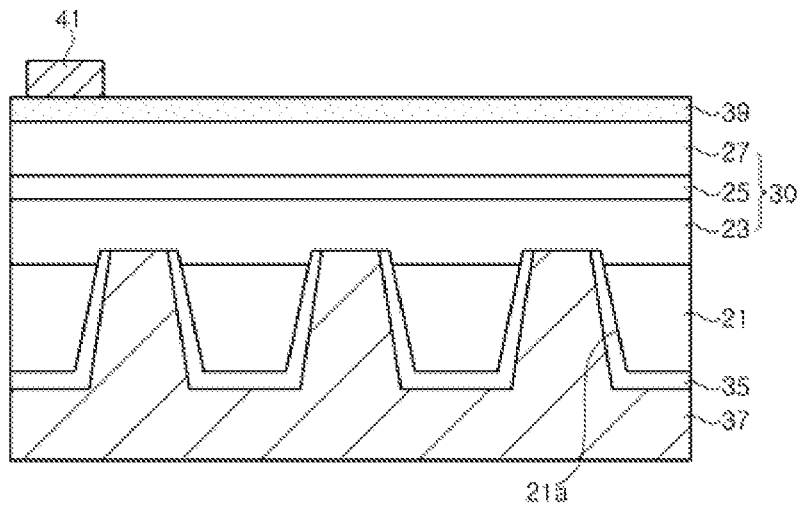
FIG. 1 is a sectional view of a light emitting diode in accordance with one embodiment of the present invention.

Hereinafter, exemplary embodiments of the present invention will be described in detail with reference to the accompanying drawings. It should be understood that the following embodiments are provided for complete disclosure and thorough understanding of the invention by those skilled in the art. Thus, it should be understood that the present invention is not limited to the following embodiments and can be embodied in different ways. In addition, in the drawings, the width, length and thickness of components may be exaggerated for convenience. Further, it should be noted that the drawings are not to precise scale. Like components will be denoted by like reference numerals throughout the specification.

FIG. 1 is a sectional view of a light emitting diode in accordance with one embodiment of the present invention.

Referring to FIG. 1, a light emitting diode according to one embodiment of the invention includes a GaN substrate 21, a first conductive-type semiconductor layer 23, an active layer 25, and a second conductive-type semiconductor layer 27. The light emitting diode may further include a reflector 35, a first electrode 37, a transparent electrode 39, and a second electrode 41.

The GaN substrate 21 can have a thickness from about 200 µm to about 350 µm. A semiconductor stack or laminate structure 30 is placed on or over the GaN substrate 21. The semiconductor stack or laminate structure 30 is composed of semiconductor layers including the first conductive-type semiconductor layer 23, the active layer 25, and the second conductive-type semiconductor layer 27. Here, the first conductive-type semiconductor layer 23 and the second conductive-type semiconductor layer 27 are n-type and p-type semiconductor layers, respectively. The n-type semiconductor layer 23 is disposed closer to the substrate 21 than the p-type semiconductor layer 27.

The first conductive-type semiconductor layer 23, the active layer 25, and the second conductive-type semiconductor layer 27 are formed of GaN-based compound semiconductors. In addition, the active layer 25 can have a single quantum well structure or a multi-quantum well structure.

The semiconductor stack or laminate structure 30 is composed or formed of semiconductor layers grown on the GaN substrate 21, and can have a dislocation density of about $5E6/cm^2$ or less to provide a light emitting diode which has excellent luminous efficacy and suitability for high current driving.

The GaN substrate 21 has through-holes 21a exposing the first conductive-type semiconductor layer 23 through the GaN substrate 21. The through-holes 21a can be arranged in a matrix or stripe shape. The through-holes 21a can become wider from an upper side, closer to the reflector 35, to a lower side of the substrate 21.

The first electrode 37 is electrically connected to the first conductive-type semiconductor layer 23 via the through-holes 21a. The first electrode 37 can include an ohmic metal layer for providing a connection to the first conductive-type semiconductor layer 23.

The reflector 35 is interposed between the first electrode 37 and the substrate 21. The reflector 35 can also cover sidewalls of the through-holes 21a. The reflector 35 placed within the through-holes can be formed by the same process as the reflector placed on a lower surface of the substrate 21, without being limited thereto. Alternatively, these reflectors can be formed by separate processes.

The reflector 35 reflects light generated in the active layer 27, thereby preventing light loss due to light absorption into the first electrode 37. The reflector 35 can be formed of a reflective metal layer of Ag or Al, or can be formed as an omnidirectional reflector or a distributed Bragg reflector. The distributed Bragg reflector 35 formed as a Bragg reflector can be formed by alternately stacking dielectric layers having different indexes of refraction, for example, $SiO_2$ and $TiO_2$. Here, the first layer may be formed of $SiO_2$ for good adhesion to the substrate 21 and the last layer may be formed of $SiO_2$ to protect the distributed Bragg reflector 35.

When the reflector 35 is electrically conductive, the reflector 35 can cover the first conductive-type semiconductor layer 23 exposed by the through-holes 21a. On the contrary, when the reflector 35 is electrically insulative as in the case of the distributed Bragg reflector, the reflector 35 is formed with sufficient openings so as to expose the first conductive-type semiconductor layer 23 through the reflector 35.

The transparent electrode 39 is placed on or over the second conductive-type semiconductor layer 27. The transparent electrode 39 can be formed of a transparent oxide, such ITO or ZnO, or a metal layer such as Ni/Au. The transparent electrode 39 can form ohmic contact with the second conductive-type semiconductor layer 27. The second electrode 41 may be placed on or over the transparent electrode 39 and electrically connected to the second conductive-type semiconductor layer 27 using the ohmic contact provided by the transparent electrode 39.

In this embodiment, the first electrode 37 is connected to the first conductive-type semiconductor layer 23 via the through-holes 21a. Thus, there is no need for removal of the active layer 25 in order to form the first electrode 37, and it is possible to prevent reduction in a luminous area.

Figure 2:
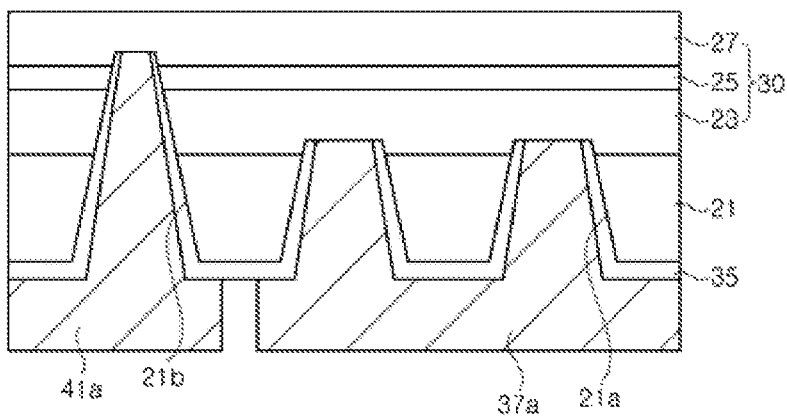
FIG. 2 is a sectional view of a light emitting diode in accordance with another embodiment of the present invention.

FIG. 2 is a sectional view of a light emitting diode in accordance with another embodiment of the present invention.

Referring to FIG. 2, a light emitting diode according to this embodiment is substantially similar to the light emitting diode described with reference to FIG. 1 except that a second electrode 41a, different from the second electrode 41 in FIG. 1, is electrically connected to a second conductive-type semiconductor layer 27 via a through-hole 21b passing through a substrate 21, a first conductive-type semiconductor layer 23, and an active layer 25.

In other words, the second electrode 41a is connected to the second conductive-type semiconductor layer 27 via the through-hole 21b, while being placed on a lower surface of the substrate 21, as in the case of the first electrode 37a. Here, in the example shown in FIG. 2, an electrically insulating reflector 35 can be interposed between the second electrode 41a and the substrate 21. As shown in FIG. 2, the first electrode 37a and the second electrode 41a can be separated from each other on the reflector 35.

On the contrary, when the reflector 35 is electrically conductive, the reflector 35 is separated so as to insulate the second electrode 41a from the first electrode 37a. In addition, the reflector 35 connected to the second electrode 41a is also separated from an insulating layer (not shown), the first conductive-type semiconductor layer 23, and the active layer 25.

According to this embodiment, as in the case of the first electrode 37a, the second electrode 41a can be formed under the substrate 21, thereby preventing light absorption into the second electrode 41a. Further, formation of the first electrode 37a and the second electrode 41a under the substrate 21 enables mounting of a light emitting diode without a bonding wire, thereby simplifying a package manufacturing process.

FIG. 3 to FIG. 8 are sectional views illustrating a method of fabricating a light emitting diode in accordance with one embodiment of the present invention.

Figure 3:
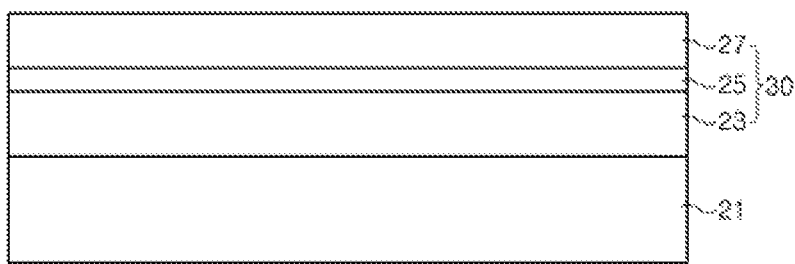
FIG. 3 to FIG. 8 are sectional views illustrating a method of fabricating a light emitting diode in accordance with one embodiment of the present invention.

Referring to FIG. 3, a stack or laminate structure 30 of GaN-based semiconductor layers including a first conductive-type semiconductor layer 23, an active layer 25, and a second conductive-type semiconductor layer 27 is grown on a GaN substrate 21.

Then, a lower surface of the substrate 21 can be flattened. The lower surface of the substrate 21 may be flattened by planarization through grinding, lapping, and polishing. Since the GaN substrate 21 is softer than a sapphire substrate, the lower surface of the GaN substrate 21 is relatively easy to remove. Accordingly, a portion of the lower surface of the substrate 21 can be removed just by mechanical polishing using a surface plate and diamond slurries. Generally, after planarization, the substrate 21 may have a thickness from 250 μm to 300 μm, and a portion removed from the lower surface of the substrate 21 may have a thickness from 20 μm to 50 μm. The lower surface of the substrate can also be polished through chemical mechanical polishing (CMP).

Generally, in a conventional method of manufacturing a light emitting diode, a process for eliminating a portion of the second conductive-type semiconductor layer 27 and the active layer 25 to expose the first conductive-type semiconductor layer 23, for example a mesa process, is carried out before planarization of the lower surface of the substrate. However, in this embodiment, the process for eliminating the second conductive-type semiconductor layer 27 and the active layer 25 to expose the first conductive-type semiconductor layer 23 is omitted.

Figure 4:
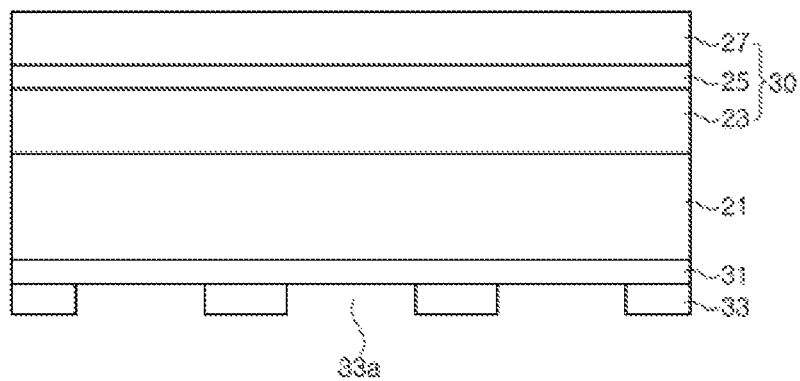

Referring to FIG. 4, an etching mask layer 31 is formed on or over the lower surface of the GaN substrate 21. The etching mask layer 31 can be formed of a silicon oxide film. In addition, a photoresist pattern 33 can be formed on or over the etching mask layer 31. The photoresist pattern 33 has openings 33a exposing the etching mask layer 31.

Figure 5:
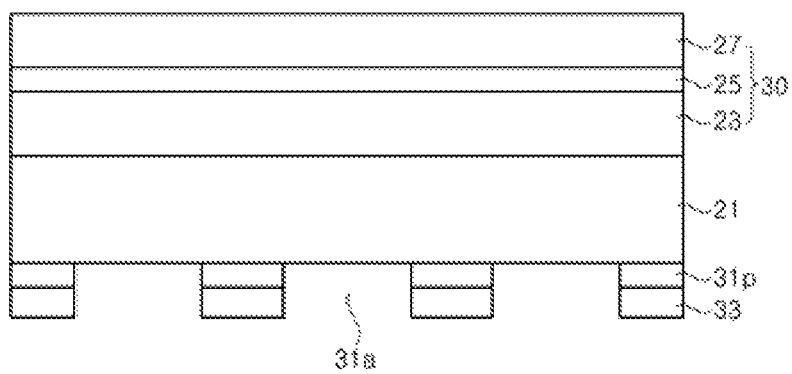

Referring to FIG. 5, the etching mask layer 31 is etched using the photoresist pattern 33 as an etching mask. The etching mask layer 31 can be etched by wet etching using hydrofluoric acid or BOE. As such, an etching mask pattern 31p is formed. The etching mask pattern 31p has openings 31a corresponding to the openings 33a of the photoresist pattern 33. The lower surface of the substrate 21 is exposed through the openings 31a and 33a.

Figure 6:
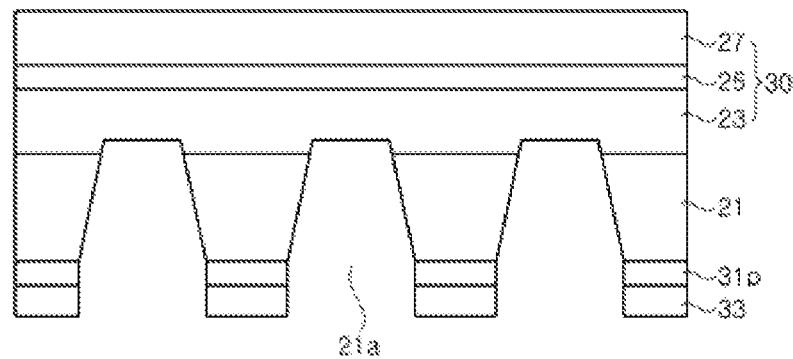

Referring to FIG. 6, a plurality of through-holes 21a exposing the first conductive-type semiconductor layer 23 is formed by etching the GaN substrate 21 using the etching mask pattern 31p as an etching mask. The GaN substrate 21 may be etched by dry etching; wet etching with sulfuric acid, phosphoric acid, nitric acid, or mixture thereof; or combination thereof.

The through-holes 21a formed by etching can have a gradually decreasing width from the lower surface, closer to the etching mask pattern 31p to the upper surface, closer to the first conductive-type semiconductor layer 23, of the substrate 21a. In addition, the first conductive-type semiconductor layer 23 can be partially etched during etching of the GaN substrate 21.

Figure 7:
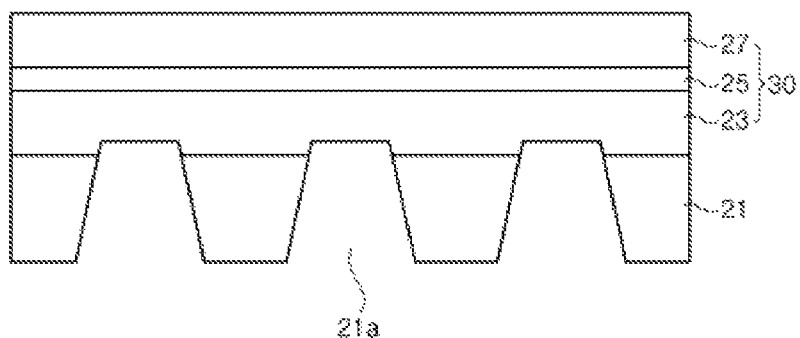

Referring to FIG. 7, the photoresist pattern 33 and the etching mask pattern 31p are removed, after forming the through-holes 21a. The photoresist pattern 33 can be removed using an organic solvent, and the etching mask pattern 31p can be removed using BOE. The photoresist pattern 33 can be removed before forming the through-holes 21a.

Figure 8:
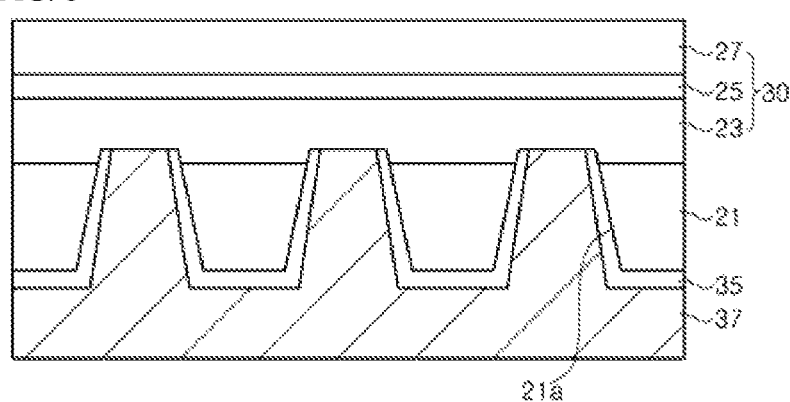

Referring to FIG. 8, a reflector 35 is formed on the lower surface of the substrate 21, after removal of the etching mask pattern 31p. The reflector 35 can be formed within the through-holes 21a to cover or at least cover sidewalls of the through-holes 21a. When the reflector 35 is electrically insulative, as shown in FIG. 8, the reflector 35 has openings exposing the first conductive-type semiconductor layer 23. The openings on the reflector 35 can be formed by photolithography and etching.

As described above, the reflector may be a reflective metal layer, an omni-directional reflector, or a distributed Bragg reflector.

The first electrode 37 is formed after forming the reflector 35. The first electrode 37 is electrically connected to the first conductive-type semiconductor layer 23 via the through-holes 21a.

When manufacturing the light emitting diode as shown in FIG. 1, a transparent electrode 39 can be formed on the semiconductor stack structure 30, followed by forming a second electrode 41 on the transparent electrode 39. The transparent electrode 39 can be formed of a transparent metal layer such as Ni/Au, or a transparent oxide layer such as ITO or ZnO.

Although the second electrode 41 is illustrated as being formed on the semiconductor stack or laminate structure 30 in the embodiment of manufacturing the light emitting diode as shown in FIG. 1, when manufacturing the light emitting diode as shown in FIG. 2, the second electrode 41a may be formed under the GaN substrate 21. For example, in addition to the through-holes 21a, a through-hole 21b (see FIG. 2) can be formed to pass through the GaN substrate 21, the first conductive-type semiconductor layer 23, and the active layer 25 so as to expose the second conductive-type semiconductor layer 27. The through-holes 21b can be provided in plural. Then, the reflector 35 is formed under the GaN substrate 21, and the first electrode 37a and second electrode 41a can be formed on the reflector 35 so as to be electrically separated from each other. Here, the first electrode 37a is connected to the first conductive-type semiconductor layer 23 via the through-holes 21a, while the second electrode 41a is connected to second conductive-type semiconductor layer via the through-hole 21b.

Although various embodiments and features of the present invention have been described above, the present invention is not limited thereto, and various changes and modifications can be made without departing from the spirit and the scope of the present invention.

What is claimed is:

1. A light emitting diode comprising:
   a GaN substrate having a plurality of through-holes;
   a GaN-based semiconductor stack structure placed on the substrate, and including a first conductive-type semiconductor layer, a second conductive-type semiconductor layer, and an active layer interposed between the first conductive-type semiconductor layer and the second conductive-type semiconductor layer, the first conductive-type semiconductor layer being disposed closer to the GAN substrate than the second conductive-type semiconductor layer;
   a first electrode electrically connected to the first conductive-type semiconductor layer via the through-holes; and
   a reflector interposed between the first electrode and the GaN substrate.

2. The light emitting diode according to claim 1, wherein the reflector extends into the through-holes.

3. The light emitting diode according to claim 2, wherein the reflector is a reflective metal layer, an omni-directional reflector, or a distributed Bragg reflector.

4. The light emitting diode according to claim 1, wherein the first conductive-type semiconductor layer includes an n-type semiconductor layer.

5. The light emitting diode according to claim 1, further comprising: a second electrode,
   wherein the second electrode is electrically connected to the second conductive-type semiconductor layer via a through-hole passing through the GaN substrate, the first conductive-type semiconductor layer, and the active layer.

6. The light emitting diode according to claim 5, further comprising: a reflector interposed between the GaN substrate and the second electrode.

7. The light emitting diode according to claim 1, further comprising:
a transparent electrode disposed over the second conductive-type semiconductor layer,
wherein the transparent electrode forms a ohmic contact with the second conductive-type semiconductor layer.

8. The light emitting diode according to claim 7, wherein the transparent electrode includes a transparent oxide or a metal layer.

9. The light emitting diode according to claim 7, wherein the transparent oxide includes ITO or ZnO, and the metal layer includes Ni/Au.

10. The light emitting diode according to claim 7, further comprising:
a second electrode disposed over the transparent electrode,
wherein the second electrode is electrically connected to the second conductive-type semiconductor layer via the ohmic contact formed by the transparent electrode.

11. A method of fabricating a light emitting diode, comprising:
growing a first conductive-type semiconductor layer, an active layer, and a second conductive-type semiconductor layer on a GaN substrate;
forming a plurality of through-holes in the GaN substrate to expose the first conductive-type semiconductor layer; and
forming a first electrode electrically connected to the first conductive-type semiconductor layer via the through-holes,
wherein the method further comprises forming a reflector covering a lower surface of the GaN substrate, before forming the first electrode and the reflector covers sidewalls of the through-holes.

12. The method according to claim 11, wherein the reflector is a reflective metal layer, an omni-directional reflector, or a distributed Bragg reflector.

13. The method according to claim 12, further comprising:
forming a through-hole passing through the GaN substrate, the first conductive-type semiconductor layer, and the active layer; and
forming a second electrode electrically connected to the second conductive-type semiconductor layer via the through-hole passing through the active layer.

14. The method according to claim 13, further comprising:
forming a reflector covering a lower surface of the GaN substrate, before forming the second electrode.

15. The method according to claim 14, wherein the first electrode and the second electrode are formed at the same time by the same process.

16. The method according to claim 11, further comprising:
disposing a transparent electrode over the second conductive-type semiconductor layer,
wherein the transparent electrode forms a ohmic contact with the second conductive-type semiconductor layer.

17. The method according to claim 16, further comprising:
disposing a second electrode over the transparent electrode,
wherein the second electrode is electrically connected to the second conductive-type semiconductor layer via the ohmic contact formed by the transparent electrode.

* * * * *